United States Patent
Turcan

(10) Patent No.: US 10,862,294 B2
(45) Date of Patent: Dec. 8, 2020

(54) UNDER-VOLTAGE AND OVER-VOLTAGE PROTECTION USING A SINGLE COMPARATOR

(71) Applicant: Microchip Technology Incorporated, Chandler, AZ (US)

(72) Inventor: Gheorghe Turcan, Bucharest (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 311 days.

(21) Appl. No.: 15/959,870

(22) Filed: Apr. 23, 2018

(65) Prior Publication Data
US 2019/0260199 A1     Aug. 22, 2019

Related U.S. Application Data

(60) Provisional application No. 62/631,601, filed on Feb. 16, 2018.

(51) Int. Cl.
| | |
|---|---|
| H02M 1/32 | (2007.01) |
| H02H 7/12 | (2006.01) |
| H03K 5/24 | (2006.01) |
| H02H 3/20 | (2006.01) |
| H03K 7/08 | (2006.01) |

(52) U.S. Cl.
CPC .......... *H02H 7/1203* (2013.01); *H02H 3/207* (2013.01); *H02M 1/32* (2013.01); *H03K 5/24* (2013.01); *H03K 7/08* (2013.01)

(58) Field of Classification Search
CPC ....... H02H 3/207; H02H 7/1213; H02M 1/32; H03K 5/24
See application file for complete search history.

(56) References Cited

U.S. PATENT DOCUMENTS

| | | | |
|---|---|---|---|
| 2002/0097008 A1* | 7/2002 | Krummel | H05B 41/3921 315/291 |
| 2007/0002595 A1 | 1/2007 | Tzeng | 363/49 |
| 2014/0042871 A1* | 2/2014 | Lee | H02N 2/067 310/317 |
| 2017/0358990 A1 | 12/2017 | Papica | |
| 2018/0269787 A1* | 9/2018 | Chen | H02M 3/156 |

FOREIGN PATENT DOCUMENTS

EP       0978921 A2       2/2000       ............... H02H 3/06

OTHER PUBLICATIONS

International Search Report and Written Opinion, Application No. PCT/US2019/017753, 11 pages, dated May 17, 2019.

* cited by examiner

*Primary Examiner* — Harry R Behm
(74) *Attorney, Agent, or Firm* — Slayden Grubert Beard PLLC

(57) ABSTRACT

An apparatus includes a pulsed-width modulation signal corresponding to a cutoff voltage, a periodic signal generation circuit, a comparator, and logic. The comparator is configured to compare a voltage input with an output of the periodic signal generation circuit and, based on a comparison of the voltage input with the output of the periodic signal generation circuit, generate another pulsed-width modulation signal. The logic is configured to compare the pulsed-width modulation signal and the other pulsed-width modulation signal to determine whether the voltage input has reached the cutoff voltage.

20 Claims, 14 Drawing Sheets

FIG. 5B

```
PRG1_StartRampGeneration ( );

PWM5_Stop ( );
_delay_us (0.25);
PWM5_Start ( );

// When using interrupts, you need to set
// Use the following macros to:

// Enable the Global Interrupts
// INTERRUPT_GlobalInterruptEnable ( );

// Enable the Peripheral Interrupts
// INTERRUPT_PeripheralInterruptEnable ( );

// Disable the Global Interrupts
// INTERRUPT_GlobalInterruptDisable ( );

// Disable the Peripheral Interrupts
```

52
53
54
55
56
57
58
59
60
61
62
63
64
65
66
67
68
69

| Notifications | Output | Notifications [MCC] | Pin Manager: Grid View |
| --- | --- | --- | --- |
| Package | PDIP40 | ▶ Pin No: | 2 | 3 | 4 | 5 | 6 | 7 |

FROM FIG. 5A

1CMP_Test... × | main() - Naviga... | Versions [MCC]

- 1CMP_Tests
  - Project Type: Application - Configuration: default
  - Device
    - PIC16F1779
      - Checksum: 0xC619
  - Compiler Toolchain
    - XC8 (v1.44) [C:\Program Files (x86)\Microchip\xc8
      - Compiler Toolchain
  - Memory
    - Data 2048 (0x800) bytes
      - 0%
      - Data Used: 3 (0x3) Free: 2045 (0x7FD)
    - Program 16384 (0x4000) words
      - 2%
      - Program Used: 332 (0x14C) Free: 16052 (0x3
  - Debug Tool
    - ICD 3: JIT121312049
  - Debug Resources
    - ☐ Program BP Used: 0  Free: 1
    - ☐ Data BP: No Support
    - ☐ Data Capture: No Support
    - ☐ Unlimited BP (S/W): Disabled

UNDER-VOLTAGE AND OVER-VOLTAGE PROTECTION USING A SINGLE COMPARATOR

PRIORITY

This application claims priority to U.S. Provisional Application No. 62/631,601 filed Feb. 16, 2018, the contents of which are hereby incorporated in their entirety.

BACKGROUND

Over-voltage and under-voltage protection is used in many different electronic circuits and devices. Such protection may ensure that electronic devices expecting input or control signals within a given range are only within such a range. One such application may include use of over-voltage and under-voltage protection in switched-mode power supplies (SMPS). The protection may be made of transformers, transistors, switches, or other elements of the protected device.

An SMPS may be used to provide power as an SMPS typically performs with good regulation due to switched feedback, as well as efficient and economical filtering. In switched-mode power supplies, overvoltage protection may prevent the power supply output from exceeding a predetermined maximum value, thus preventing circuit malfunction and possible damage to circuitry powered by the switched-mode power supply.

SUMMARY

Embodiments of the present disclosure include an apparatus. The apparatus may include a first pulsed-width modulation signal corresponding to a first cutoff voltage, a periodic signal generation circuit, and a comparator. The comparator may be configured to compare a voltage input with an output of the periodic signal generation circuit and, based on a comparison of the voltage input with the output of the periodic signal generation circuit, generate a second pulsed-width modulation signal. The apparatus may further include logic configured to compare the first pulsed-width modulation signal and the second pulsed-width modulation signal to determine whether the voltage input has reached the first cutoff voltage.

In combination with any of the above embodiments, the first pulsed-width modulation signal may be generated by a pulsed-width modulation signal generator.

In combination with any of the above embodiments, the periodic signal generation circuit may be configured to generate a sawtooth signal. In combination with any of the above embodiments, an upper bound of the output of the signal generation circuit may correspond to an upper voltage limit for the voltage input, and a lower bound of the output of the signal generation circuit may correspond to a lower voltage limit for the voltage input.

In combination with any of the above embodiments, the apparatus may further include a third pulsed-width modulation signal corresponding to a second cutoff voltage, and logic configured to compare the second pulsed-width modulation signal and the third pulsed-width modulation signal to determine whether the voltage input has reached the second cutoff voltage. In combination with any of the above embodiments, the apparatus may include a third pulsed-width modulation generator to generate the third modulation signal.

In combination with any of the above embodiments, the apparatus may further include a single logic output representing whether the voltage input has reached the second cutoff voltage or the first cutoff voltage.

In combination with any of the above embodiments, the logic configured to compare the first pulsed-width modulation signal and the second pulsed-width modulation signal may include an AND operation with a first input of the first pulsed-width modulation signal and a second input of the second pulsed-width modulation signal.

In combination with any of the above embodiments, the first pulsed-width modulation signal may be delayed to match the output of the comparator.

In combination with any of the above embodiments, the logic configured to compare the first pulsed-width modulation signal and the second pulsed-width modulation signal may be configured to provide a logic output to a shut-off of a switched-mode power supply output generator.

Embodiments of the present disclosure may include microcontrollers, power controllers, power supplies, power converters, or electronic devices including any of the apparatuses of the above embodiments.

Embodiments of the present disclosure may include methods performed by the operation of any of the above embodiments of apparatuses, microcontrollers, power controllers, power supplies, power converters, or electronic devices.

BRIEF DESCRIPTION OF THE DRAWINGS

FIGS. 5A and 5B illustrate example code to operate the microcontroller, according to embodiments of the present disclosure.

DETAILED DESCRIPTION

Figure 1:
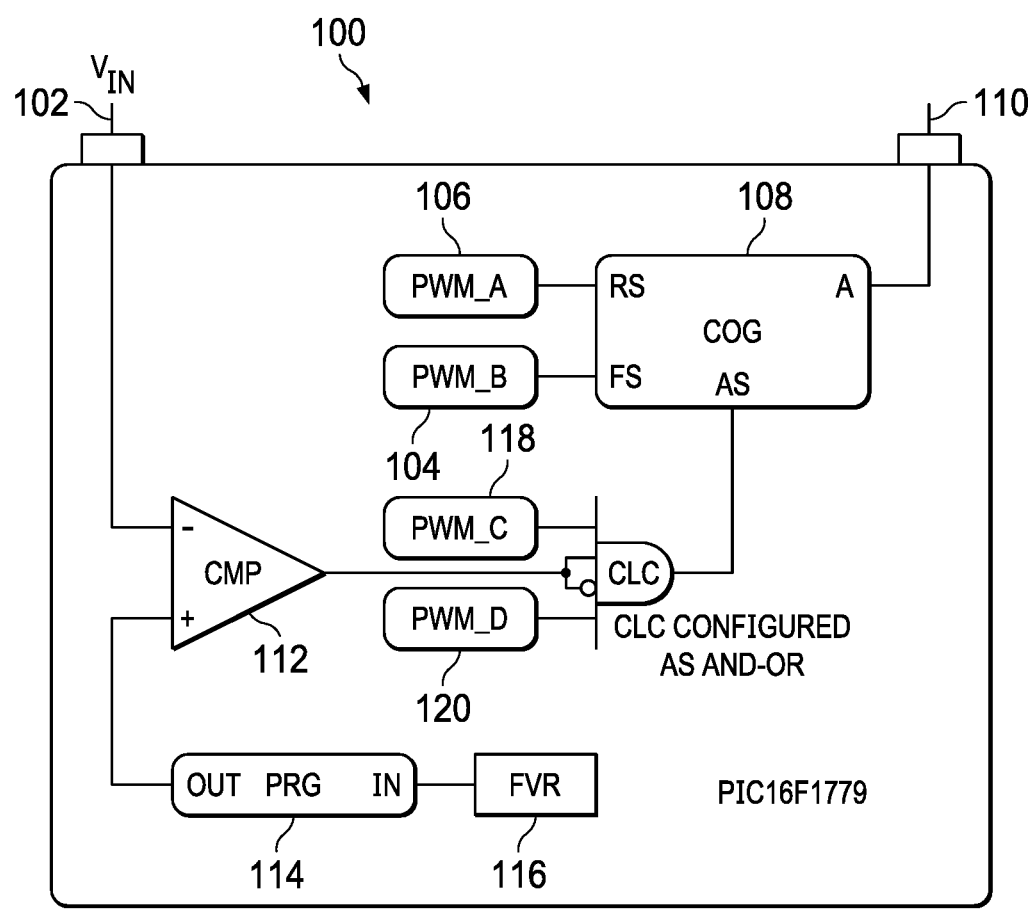
FIG. 1 is an illustration of a circuit configured to perform under-voltage and over-voltage protection, according embodiments of the present disclosure.

FIG. 1 is an illustration of a circuit 100, according to embodiments of the present disclosure. In one embodiment, circuit 100 may be configured to perform over-voltage protection. In another embodiment, circuit 100 may be configured to perform under-voltage protection. In yet another embodiment, circuit 100 may be configured to perform both over-voltage and under-voltage protection. In a further embodiment, circuit 100 may be configured to perform over-voltage and under-voltage protection with use of a single comparator. Circuit 100 may be configured to indicate whether a monitored voltage level is located between or outside of two desired boundaries.

Other solutions for over-voltage and under-voltage protection utilize two comparators. Each such comparator may be configured to compare a present feedback voltage against a respective reference voltage. Each comparator may thus separately identify over-voltage and under-voltage conditions. Accordingly, a separate comparator may be used for each of the over-voltage determination and the under-voltage determination. In contrast, circuit 100 may utilize a single comparator 112.

Circuit 100 may include one comparator 112, one programable ramp generator 114, one configurable logic cell 124, and two pulsed-width modulation (PWM) signals PWM_C 118 and PWM_D 120 to identify under-voltage and over-voltage of an input voltage 102 to circuit 100. While circuit 100 may include other comparators (not shown), or while circuit 100 may be included in a suitable larger system that includes other comparators (not shown), no other comparators might need to be used to perform under-voltage and over-voltage within circuit 100.

Circuit 100 may be included in any suitable larger system, module, CPU-independent peripheral (CIP), controller, SMPS controller, or electronic device. Circuit 100 may be implemented as a CIP in a microcontroller, for example. By implementing circuit 100 as a CIP, once circuit 100 is operating it may operate independently of a CPU of the microcontroller. That is, circuit 100 might not require software or execution of instructions to perform its ongoing monitoring of input voltage 102 for under-voltage or over-voltage conditions. The specific values of a high voltage and a low voltage may be set by software in, for example, registers that are translated for use by circuit 100. However, circuit 100 itself might not require ongoing instructions from a CPU to perform its functionality.

When used in an SMPS controller, CIPs of a microcontroller may provide components for a control loop, using a comparator. Furthermore, a peak current limit may utilize another comparator. In addition, a comparator may be used for short circuit detection. These comparators may be used in addition to comparator 112 of circuit 100. However, such comparators might not be used for over-voltage or under-voltage detection. Circuit 100 may be implemented in, for example, a PIC16F1769, PIC16F1779, or similar microcontroller available from the assignee of the present disclosure, Microchip Technology. Such a microcontroller may include four internal comparators in its CIPS. Thus, three comparators available on the microcontroller may be used for a main SMPS loop with short circuit and peak current protection. Accordingly, circuit 100 may be used in order to implement under-voltage and over-voltage protection with the single remaining comparator. Furthermore, use of the single remaining comparator may be performed without core-dependent components such as an analog-to-digital converter (ADC). Use of a core-dependent component such as the ADC requires constant monitoring by the core. The ADC may measure the voltage every desired cycle time and use the obtained value to a function that decides if either an under voltage or over voltage event is occurring.

The elements of circuit 100 may be implemented by analog circuitry, digital circuitry, or any suitable combination thereof. Circuit 100 may include a fixed voltage reference (FVR) 116. FVR 116 may be used as input to programmable ramp generator (PRG) 114. PRG 114 may be configured to generate a periodic sawtooth triangular, inverse sawtooth, or similar signal. The signal may rise from a zeroed level to the voltage limit. The generated sawtooth signal may have a same frequency as the SMPS itself. The sawtooth signal may be compared to input voltage 102. The result may be a conversion of input voltage information to a PWM signal. FVR 116 may thus provide a switching frequency for PRG 114. FVR 116 frequency may be the same as the switching frequency of an SMPS in which circuit 100 is implemented or communicatively coupled. If FVR 116 frequency is faster than the switching frequency of the SMPS, then shut-off and voltage protection may be performed faster than the SMPS can otherwise act. The frequency of detection of over-voltage and under-voltage monitoring should be as fast or faster than the SMPS switching frequency, or else over-voltage or under-voltage conditions might occur but yet go undetected.

PRG 114 may be configured to sample its own input voltage. PRG 114 may be set to generate a triangular waveform. The period of the signal generated by PRG 114 may be configured to directly generate the output signal period of comparator 112. Accordingly, the period of PRG 114 may be considered as the sampling speed. The slope, rising and falling times of the triangular waveform generated by PRG 114 may be configurable. A user of circuit 100 may thus set the sampling frequency and accepted magnitude of the measured voltage.

Comparator 112 may have as as negated input the measured voltage VIN 102 and as a positive input the output from PRG 114. Output of comparator 112 may convert the measured voltage level from VIN 102 as a duty cycle value to a pulsing signal. Output of comparator 112 may be a PWM signal.

The resulting PWM signal from comparator 112 may be issued to CLC 124. In one embodiment, CLC 124 may be implemented as a four-input AND-OR circuit. The AND-OR circuit may be implemented as a two-stage circuit, wherein a first pair of inputs are AND'd together, a second pair of inputs are AND'd together, and the results of the AND operations are OR'd together. In the first pair of inputs, the resulting PWM signal from comparator 112 may be AND'd with PWM_C 118. In the second pair of inputs, the resulting PWM signal from comparator 112 may be negated and then AND'd with PWM_D 120. CLC 124 may be configured to perform operations similar to a PWM signal comparator and outputs a logic low or high whenever an under voltage or over voltage event occurs.

CLC 124 may go to logic "1" when the monitored input voltage level is lower or higher than the desired limits and may remain as logic "0" when the voltage level is in the desired boundaries. The first "AND" has as inputs PWM_C 118 and output of comparator 112 so the output is generating a logic "1" only when the measured input voltage level is lower than the desired value. The second "AND" has as inputs the negated output of comparator 112 and PWM_D 120 so the output is generating a logic "1" only when the measured input voltage level is higher than the desired value.

PWM_C 118 may be used to set the desired minimum accepted input voltage level (UVP level) and is in sync with comparator 112 output PWM signal. A user can control the limit by changing the PWM_C duty cycle.

PWM_D 120 may be used to set the desired maximum accepted input voltage level (OVP level) and is in sync with the comparator output PWM signal. A user can control the limit by changing the PWM_D duty cycle and start position.

PWM_C 118 may be implemented as a PWM signal that is generated from a PWM generation circuit. PWM_C 118 may include a duty cycle implemented that correspond to an under-voltage condition. PWM_D 120 may be implemented as a PWM signal that is generated from a PWM generation circuit. PWM_D 120 may include a duty cycle implemented that correspond to an over-voltage condition. The PWM generation circuits that generated PWM_C 118 and PWM_D 120 may set according to user-provided values through, for example, register values. Thus, the duty cycle of the PWM signals are configurable and associated with values that correspond respectively to under-voltage and over-voltage conditions.

If the resulting signal from comparator 112 reaches the levels specified by either PWM_C 118 or PWM_D 120, output of CLC 124 may be set (in one embodiment, low) so as to cause shutdown of SMPS operation. Output of CLC 124 may be provided to a complementary output generator (COG) 108. COG 108 may be implemented by any suitable combination of circuitry and may be configured to generate a duty cycle of the larger SMPS, thus controlling the SMPS conversion and generation. The duty cycle may be implemented in a control signal 110 output from COG 108, and may be used to start or stop voltage output transistors. Output of CLC 124 may be provided to an auto-shutdown (AS) input of COG 108. When a shutdown signal (high or low, depending upon configuration) is received at the AS input of COG 108, COG 108 may stop output conversion, cutting connection between input voltage and output voltage in the SMPS. Upon a shutdown signal, triggered, for example, by an over-voltage or under-voltage condition reported through CLC 124, COG 124 may remain shutdown or automatically restart.

PWM_A 106 and PWM_B 104 may be generated by PWM sources. PWM_A 106 may be configured to generate operating frequency of COG 124 and of the larger SMPS. PWM_A may be configurable. PWM_B 104 may be a limit of the maximum duty cycle to be generated.

In one embodiment, PWM_A 106 may be reused to provide PWM_C 118 or PWM_D 120. In such a case, the duty cycle of PWM_A 106 might not be useful to COG 124. COG 124 might only use the frequency of PWM_A 106. The duty cycle of PWM_106 might not be considered by COG 124. Thus, PWM_A 106 might be set specifically with a duty cycle for use according to an under-voltage or over-voltage condition and reused as PWM_C 118 or PWM_D 120. Accordingly, PWM_A 106 might be reused for both COG 124 and one of PWM_C 118 or PWM_D 120, and may be designed with a frequency and a duty cycle to fulfill both roles.

PWM signals may be generated by various CIPs or other components available on a system or microcontroller in which circuit 100 is implemented. The frequency and duty cycle of generated PWM signals may be set according to registers or commands.

Figure 2:
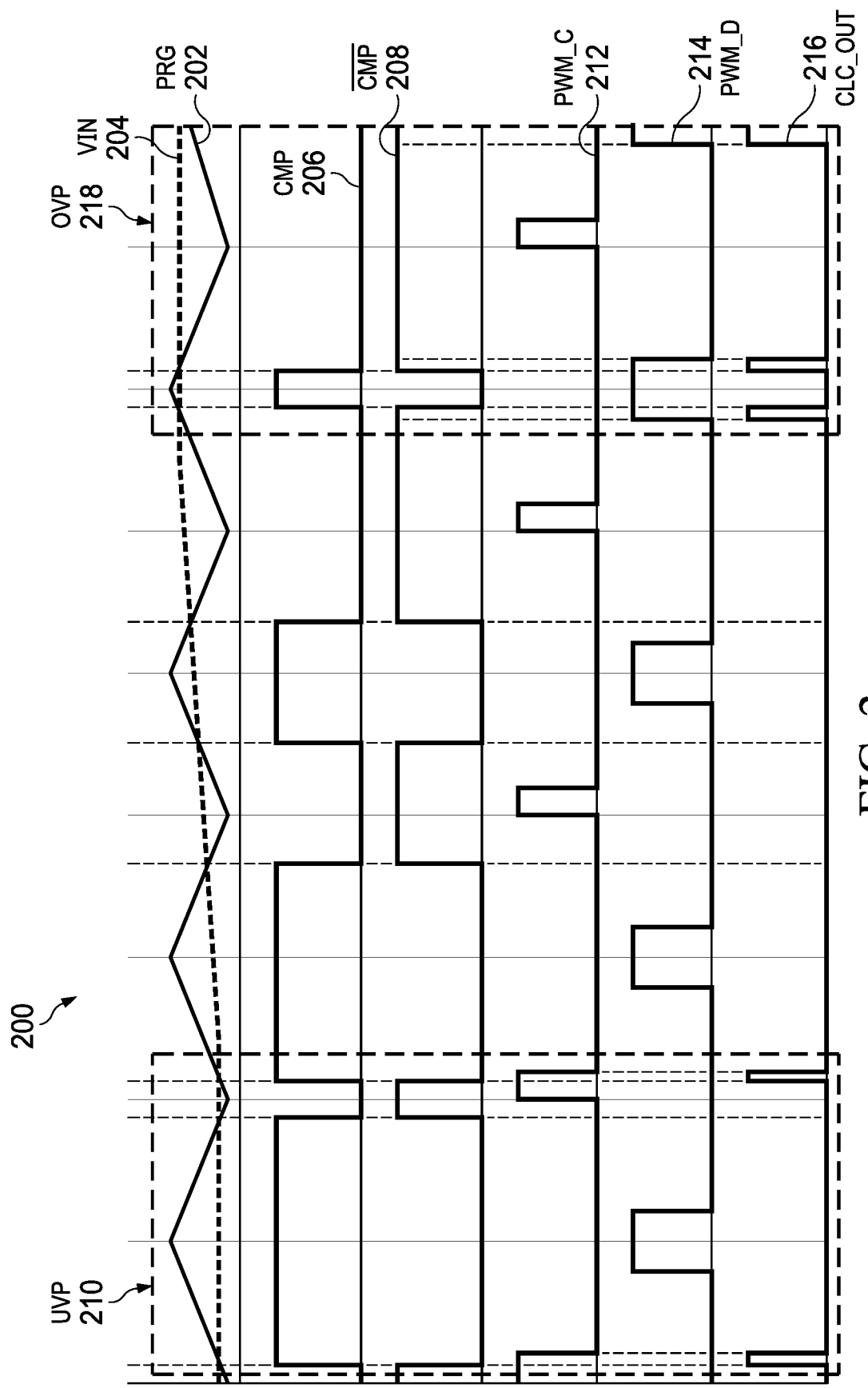
FIG. 2 is a timing diagram of a circuit configured to perform under-voltage and over-voltage protection, according embodiments of the present disclosure.

FIG. 2 is an illustration of a timing diagram 200, according to embodiments of the present disclosure. The timing diagram may illustrate operation of circuit 100.

PRG 202 illustrates an example periodic signal, such as a sawtooth signal. PRG 202 may represent possible output of PRG 114.

VIN 204 illustrates example input voltage, such as that received at VIN 102. VIN 204 will change over time according to the input voltage that is actually received.

CMP 206 and ~CMP 208 may be inverses of each other. CMP 206 may include the output of comparator 112.

PWM_C 212 may illustrate performance of PWM_C 118. PWM_D 214 may illustrate performance of PWM_D 120.

CLC_OUT 216 may illustrate output of CLC 124.

As shown in FIG. 2, two instances of under-voltage protection may be warranted, demonstrated in block UVP 210. Moreover, three instances of over-voltage protection may be warranted, demonstrated in block OVP 218. Dotted vertical lines in FIG. 2 may illustrate specific times at which events are occurring together among the illustrated signals.

VIN 204 may be flat in each of UVP 210 and OVP 218 blocks or regions. VIN 204 may rise between UVP 210 and OVP 218 blocks or regions.

As shown, as VIN 204 is below an under-voltage signal in UVP 210, CLC_OUT 216 may pulse accordingly. VIN 204 is an over-voltage signal in OVP 218, and CLC_OUT 216 may pulse accordingly. However, CLC_OUT might not necessarily pulse constantly or for the duration of the period of under-voltage or over-voltage. Instead, in one embodiment CLC_OUT may pulse once during a period of PRG 202 when under-voltage or over-voltage is encountered.

As discussed above, PWM_C 118/212 and PWM_D 120/214 may be controllable references whose duty cycles correspond to particular voltages. The PWM signals may be determined experimentally, wherein a particular cutoff voltage is passed through a comparator, such as shown in FIG. 1, along with a reference sawtooth signal. The resultant signal may be observed and reproduced according to its duty cycle to implement PWM_C or PWM_D.

Figure 3:
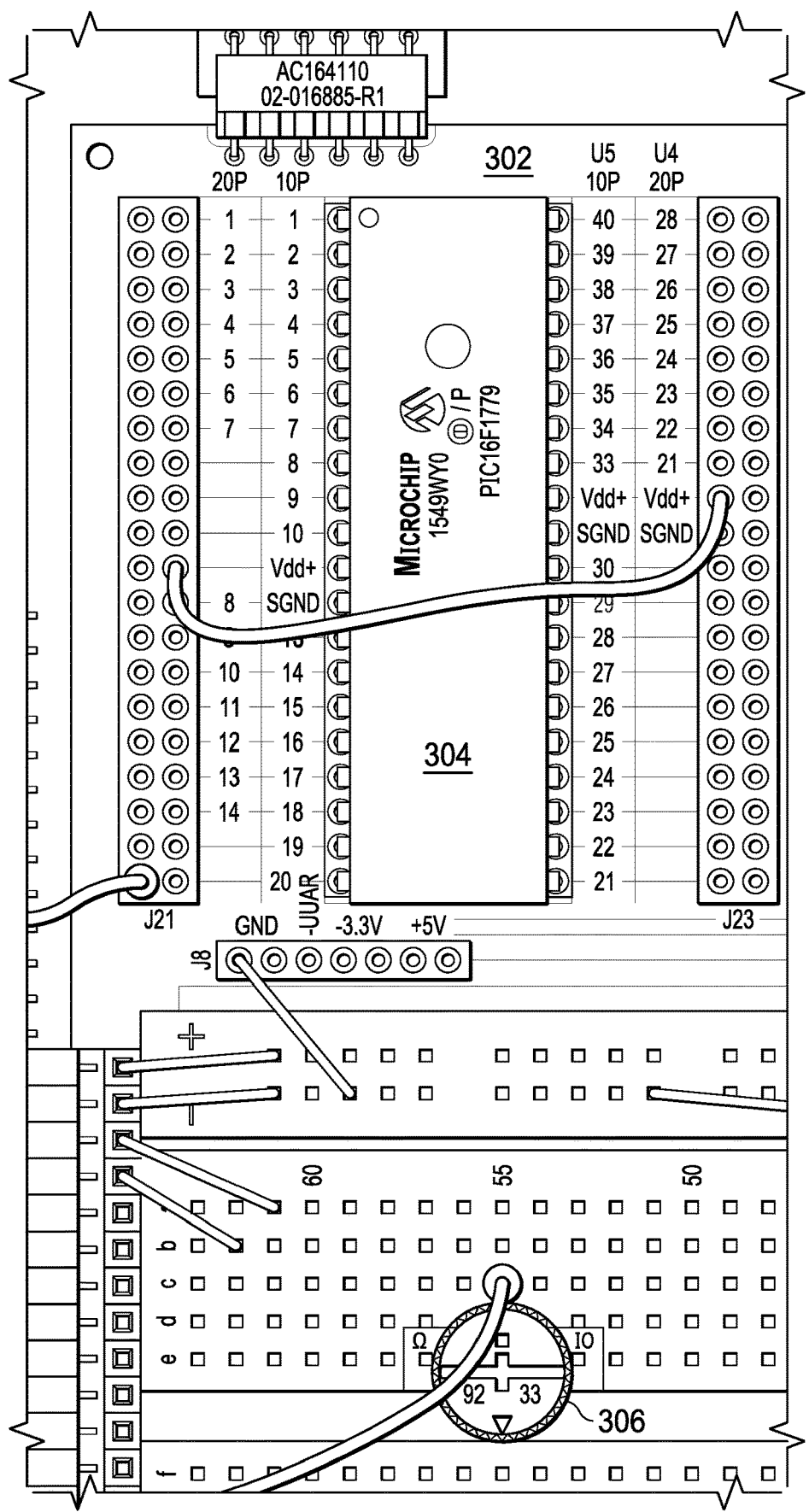
FIG. 3 illustrates an example test setup, according to embodiments of the present disclosure.

FIG. 3 depicts an example test setup, according to embodiments of the present disclosure. Other test configurations may be used, although the contents of FIG. 3 are presented as a mere example.

To test functionality or determine PWM signals experimentally, the following equipment may be used, as an example: a PICDEM LAB II board 302, a PIC16F176X/7X microcontroller 304, a potentiometer 306 to simulate the variable input voltage, wires, MPLAB ICD3 PIC programmer (not shown), and an oscilloscope (not shown) to verify the signals. VDD may be provided by the MPLAB ICD3 PIC3 programmer.

The configurations may be set using the MPLAB CODE CONFIGURATOR software plugin from MPLABX. The plugin may include code snippets to start PRG 114 and adjust PWM_D 120 (denoted as PWM5 in code below) start time. After such configuration, circuit 100 may operate independent of any core intervention.

For microcontroller 304, a PIC internal oscillator 32 MHz (8 MHz×4PLL) may be used.

Figure 4A:
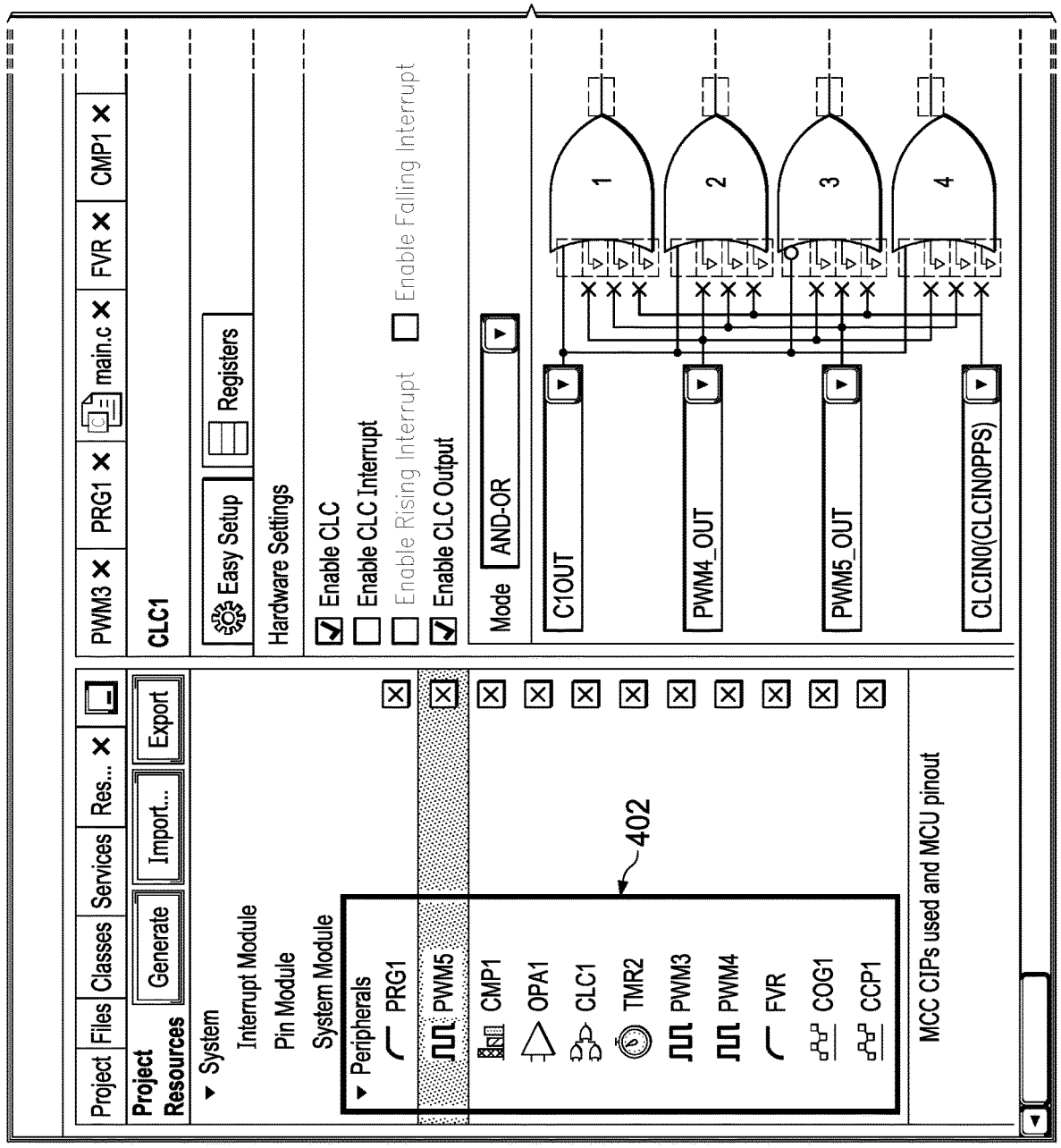
FIGS. 4A and 4B illustrate peripherals used and a pinout of the microcontroller, according to embodiments of the present disclosure.
Figure 4B:
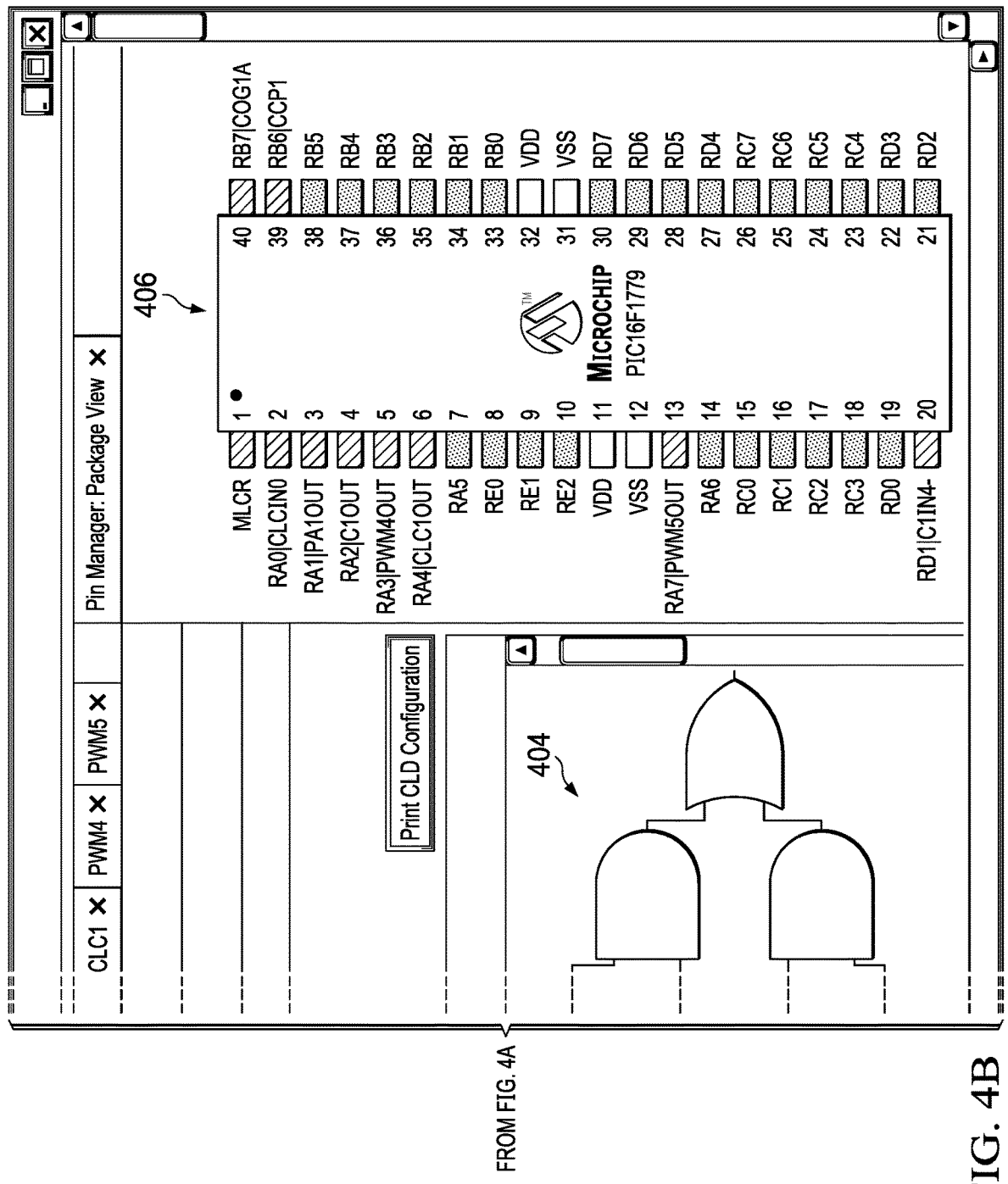

FIGS. 4A and 4B illustrate peripherals used and a pinout of the microcontroller, according to embodiments of the present disclosure. FIG. 4 may illustrate a screenshot of software used to program microcontroller 304. View 402 may illustrate CIPs selected to be used in operation. View 404 may illustrate configuration of CLC 124. View 406 may illustrate a pinout of microcontroller 304.

The following CIPs of microcontroller 304 may be used, along with example settings:

TMR2: may be set with a period of 2 µs to decide the SMPS switching frequency

CCP1: period from TMR2, set to a duty cycle of 70%; a CCP1 low-to-high transition may trigger the rising event of COG 108; a CCP1 high-to-low transition may trigger the falling event of COG 108 as a maximum duty cycle limit FVR: set to 4.096V and used as the PRG source; implemented as FVR 116

PRG: implemented as PRG 114; PRG 114 may be configured as alternating ramp generator; may include a slope rate of 2.5V/µs PWM3: (not shown); 50% DC, TMR2 as source; may be used as start ramp rising and start ramp falling for PRG 114

Figure 5A:
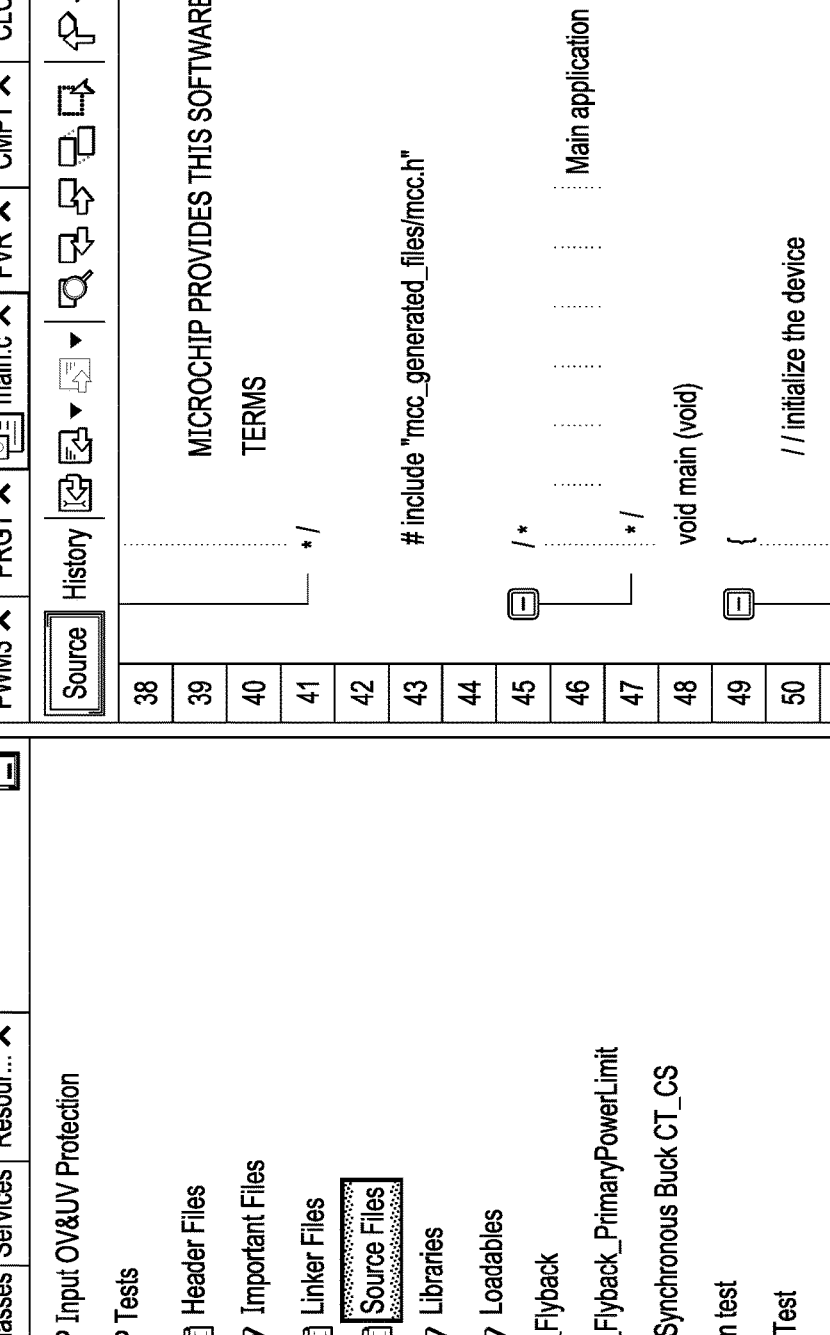

CMP1: implemented as CMP 112; the negated input may be connected to the equivalent of the input voltage, and the positive input may be connected PRG 114 output;

output of CMP1 may include a PWM signal with the duty cycle equivalent to the input voltage level CLC2: implemented as CLC 124; may be configured as AND-OR; AND1 input may be output of CMP1 and PWM4; AND2 input may be negated output of CMP1 and PWM5; the output of the CLC can be connected directly to the auto shutdown of the COG to stop the device when there is irregular input, an interrupt routine can be implemented to deal with the system during protection PWM4: implemented as PWM_C 118; the duty cycle value of this signal decides the UVP limit PWM5: implemented as PWM_D 120; the duty cycle of this signal decides the OVP limit; the start of this signal may be delayed to adjust the limiting level OPA1: set as unity gain with PRG1 set as input; may be used to monitor the internal PRG signal with the oscilloscope COG1: implemented as COG 108; may be used to verify the auto shutdown function during a protection signal FIGS. 5A and 5B illustrate example code to operate microcontroller 304, according to embodiments of the present disclosure. FIG. 5 may illustrate a screenshot of software used to program microcontroller 304. Code in FIG. 5 may start the PRG. Furthermore, code in FIG. 5 may delay the PWM5. Such a delay may synchronize PWM5 with output of CMP1.

FIGS. 6-11 illustrate results of performance of circuit 100 in test configurations, according to embodiments of the present disclosure. These may be achieved using an oscilloscope to measure the relevant signals found at the pins depicted in FIGS. 3 and 4 and a microcontroller programmed according to FIG. 5. A Capture/Compare/PWM (CCP) output such as CCP1 may be used to sync the measurements on the oscilloscope so that the captures have the same sync source.

Figure 6:
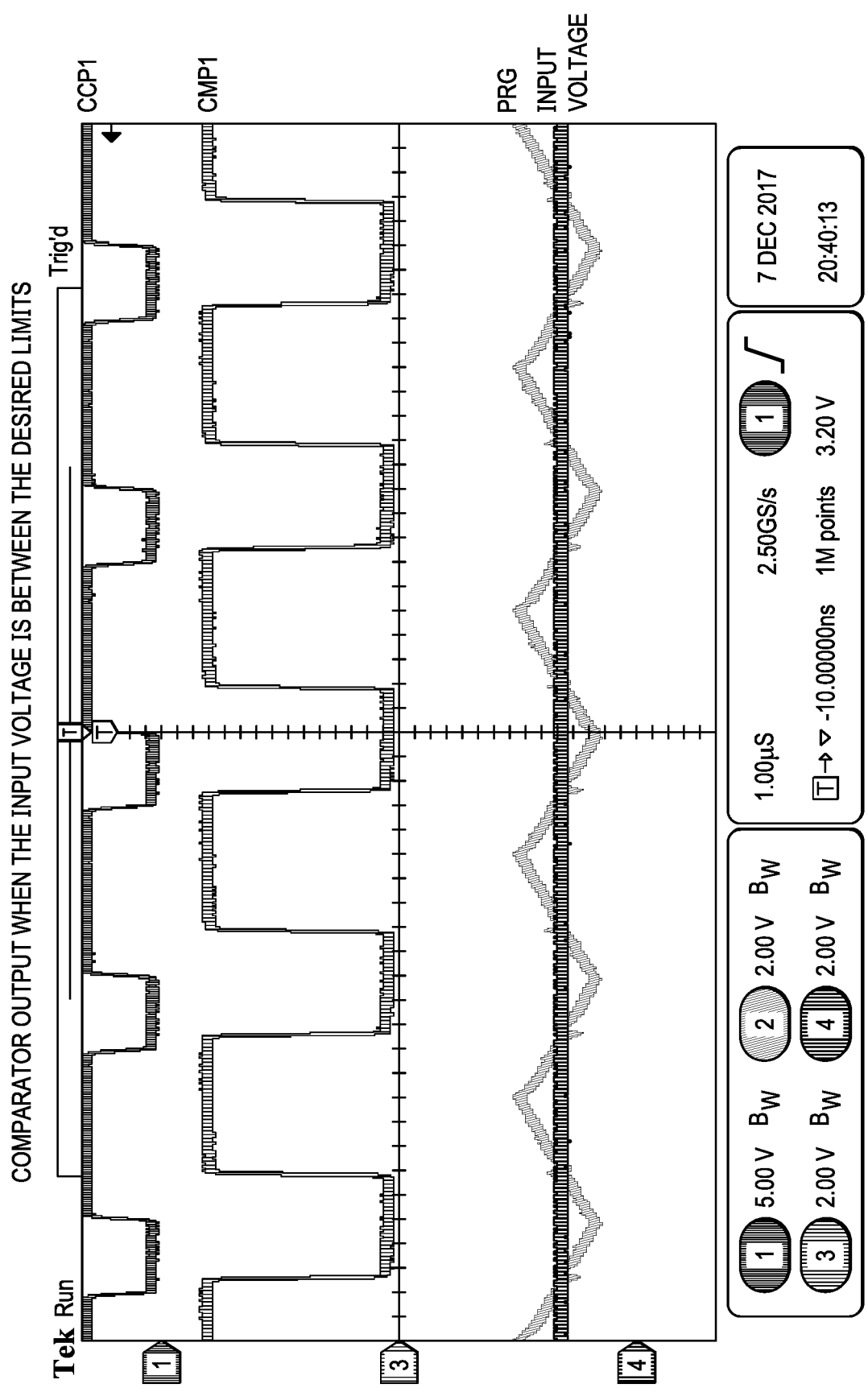
FIGS. 6-12 illustrate results of performance of circuit 100 in test configurations, according to embodiments of the present disclosure.

FIG. 6 illustrates comparator output (CMP1, comparator 112) when input voltage (VIN 102) is within an acceptable range. The acceptable range may be defined by PRG 114. Output of comparator 112 may be a PWM signal. This PWM signal may be logically AND-OR'd against PWM signals defining the high and low thresholds defined by PRG 114.

CCP1 may be implemented as a PWM with capture and compare functions. CCP1 may have the same role as PWM_A and PWM_B from FIG. 1.

Figure 7:
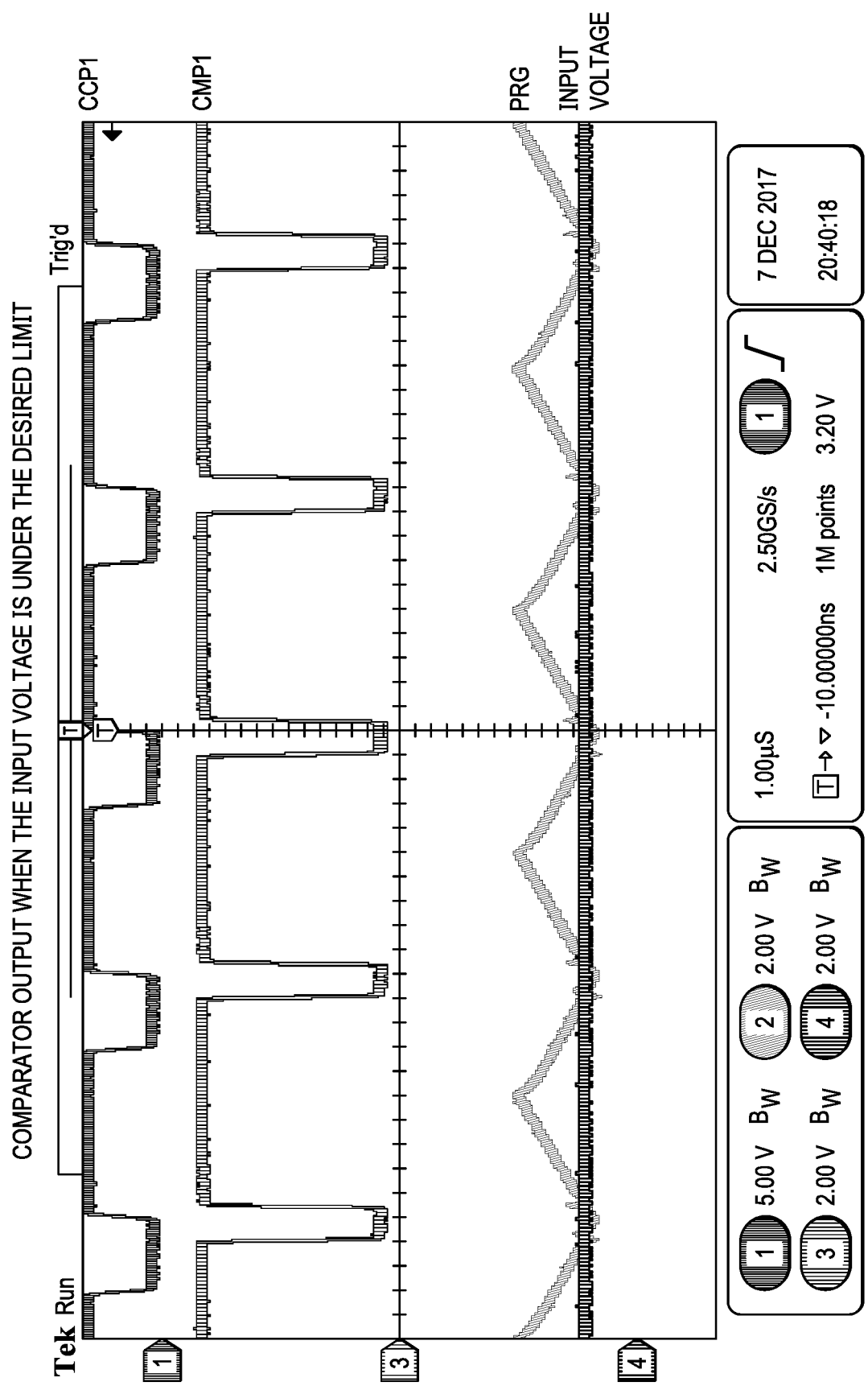

FIG. 7 illustrates comparator output (CMP1, comparator 112) when input voltage (VIN 102) is under the desired limit. When compared to FIG. 6, comparator output in FIG. 7 has a much longer part of its duty cycle in a logical "high" value. Thus, the comparator output may be logically AND-OR'd against a PWM signal with a duty cycle in a logical high value corresponding to a higher threshold of the acceptable voltage input range.

Figure 8:
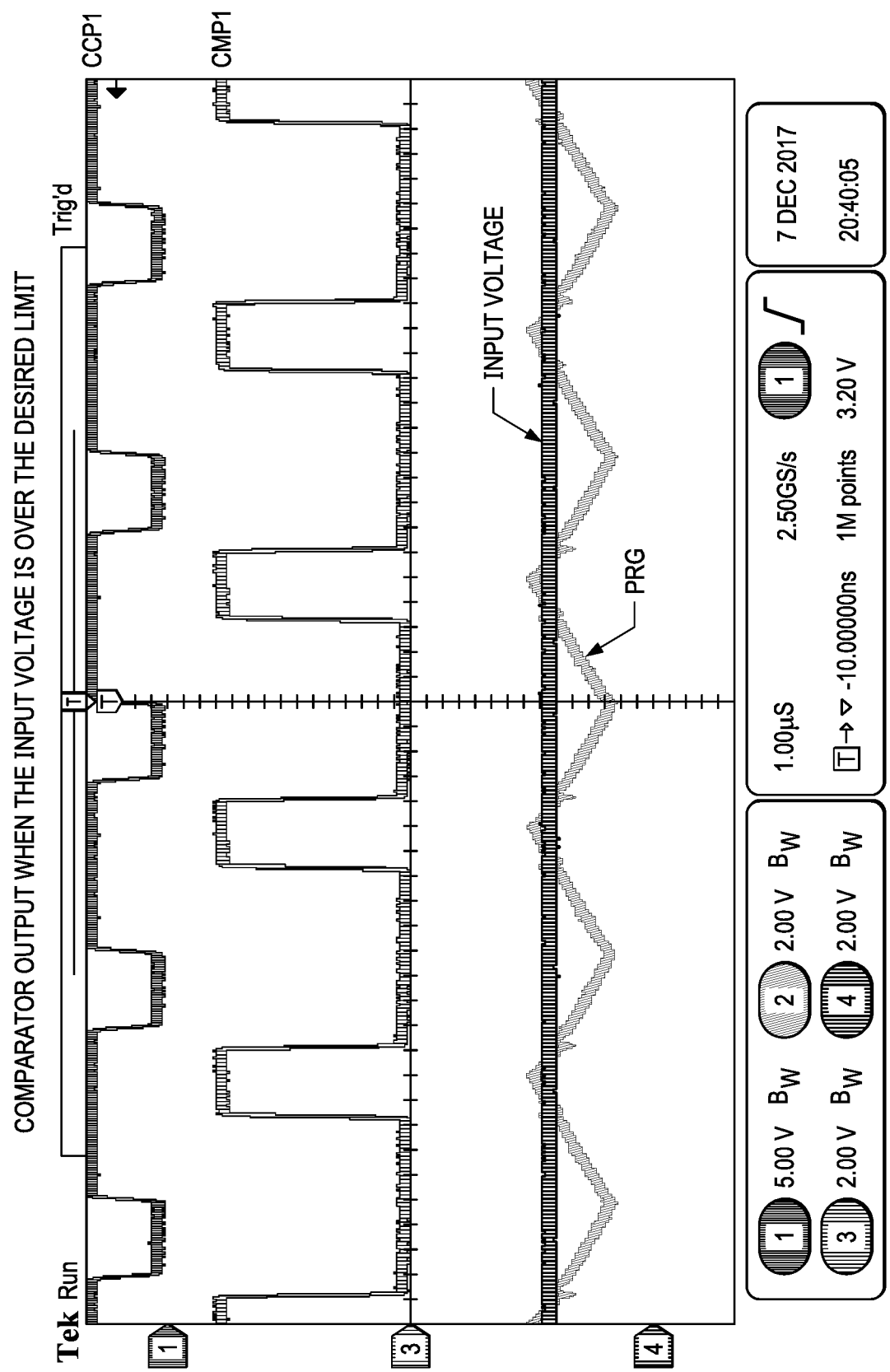

FIG. 8 illustrates comparator output (CMP1, comparator 112) when input voltage (VIN 102) is over the desired limit. When compared to FIG. 6, comparator output in FIG. 7 has a much longer part of its duty cycle in a logical "low" value. Thus, the comparator output may be logically AND-OR'd against a PWM signal with a duty cycle in a logical low value corresponding to a lower threshold of the acceptable voltage input range.

Figure 9:
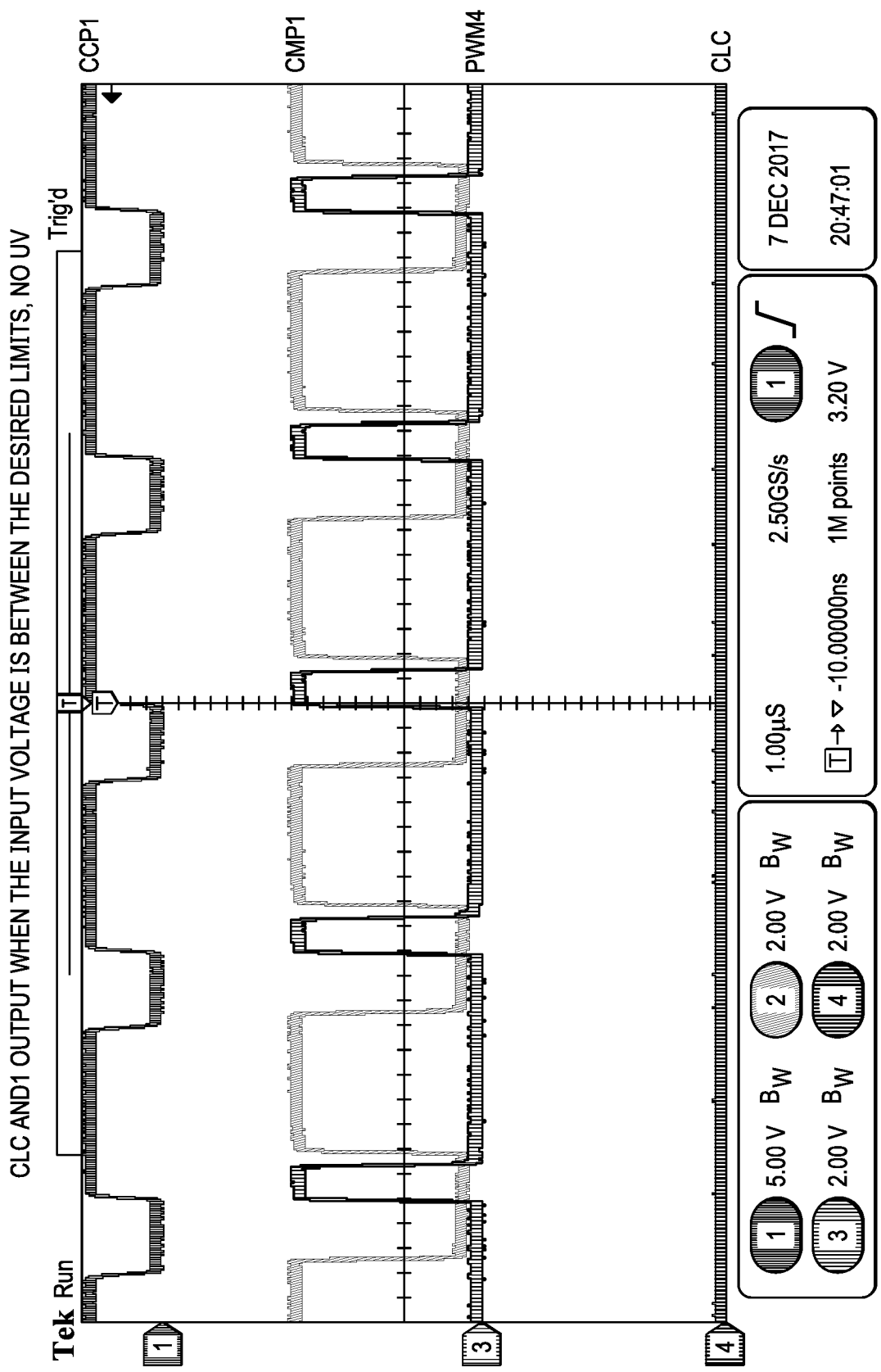

FIG. 9 illustrates CLC output (CLCAND1, CLC 124) when the input voltage is within the defined bounds. FIG. 9 may correspond to FIG. 6, but with CLC output as opposed to merely comparator output. PWM4 (PWM_C 118) is also shown. The logical AND of PWM4 and comparator output may yield no logical high conditions in the output of CLC. This may correspond to the fact that the input voltage is within the defined bounds.

Figure 10:
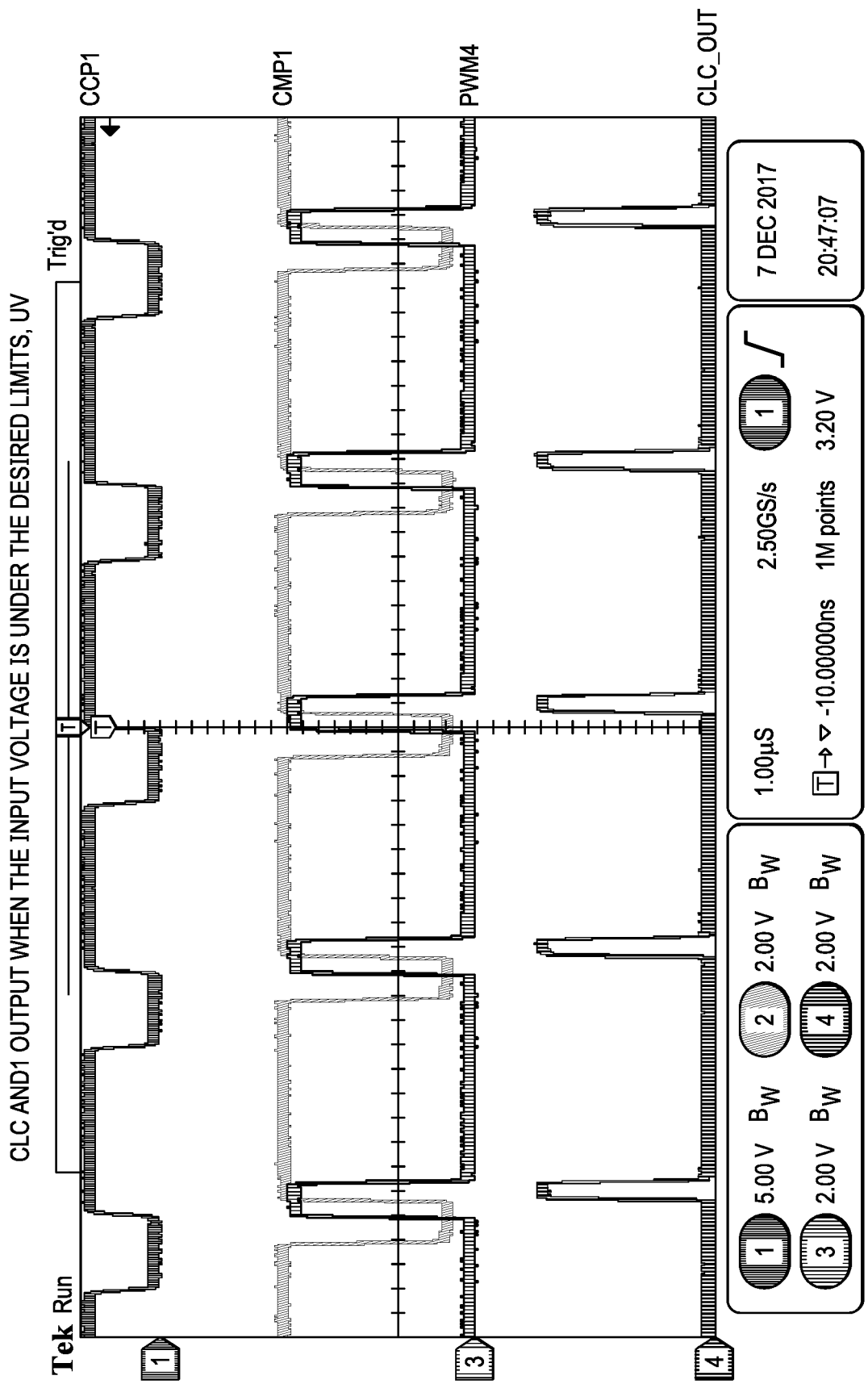

FIG. 10 illustrates CLC output (CLCAND1, CLC 124) when the input voltage is under the lower threshold voltage. FIG. 10 may correspond to FIG. 7, but with CLC output as opposed to merely comparator output. PWM4 (PWM_C 118) is also shown. The logical AND of PWM4 and comparator output may yield a logical high condition in the output of CLC. This may correspond to the fact that the input voltage is below the defined bounds.

In one embodiment, CLC output of FIGS. 9 and 10 may illustrate output of a half of a first stage of CLC 124.

Figure 11:
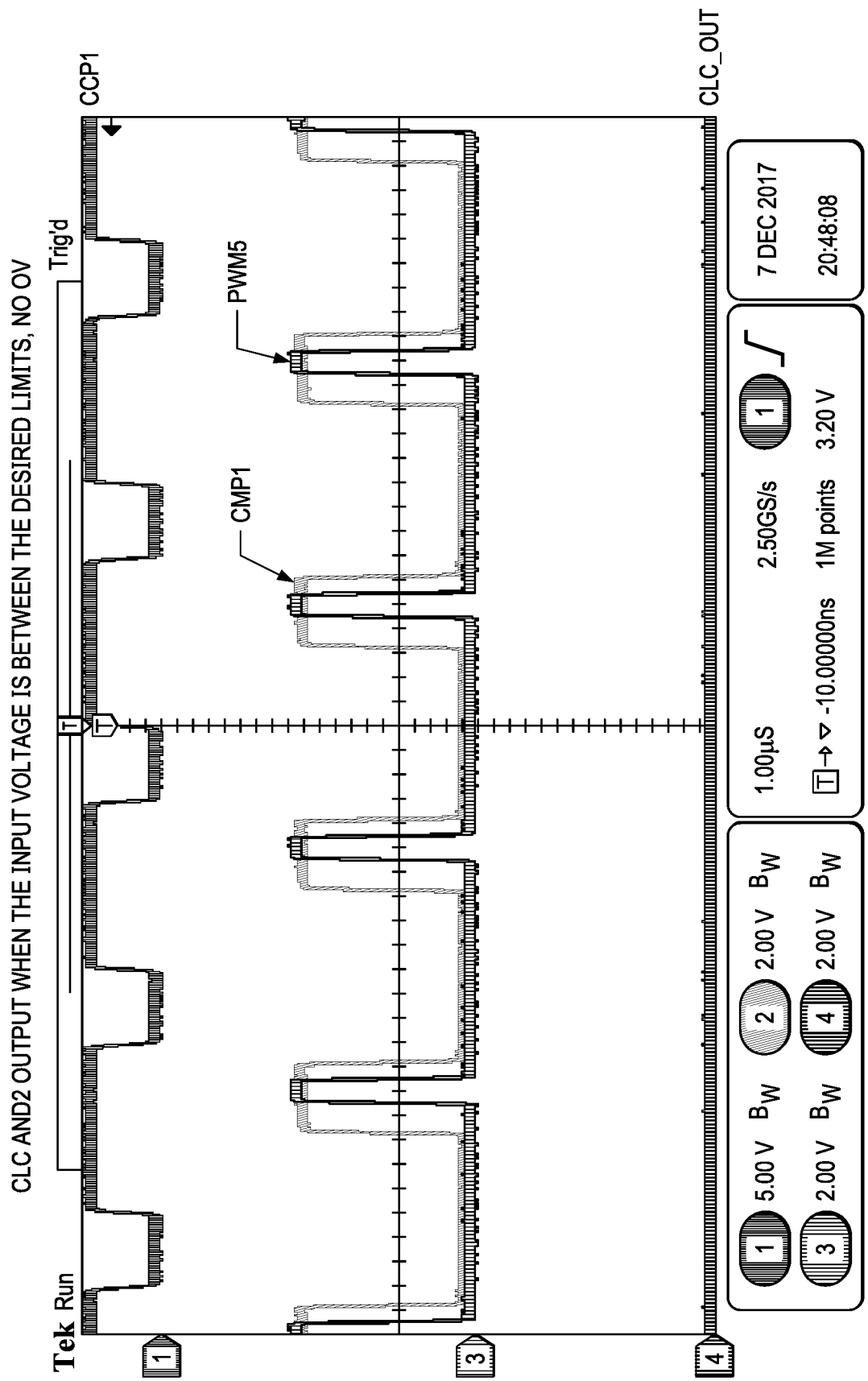

FIG. 11 illustrates CLC output (CLCAND2, CLC 124) when the input voltage is within the defined bounds. FIG. 11 may correspond to FIG. 6, but with CLC output as opposed to merely comparator output. PWM5 (PWM_D 120) is also shown. The logical AND of PWM5 and negated comparator output may yield no logical high conditions in the output of CLC. This may correspond to the fact that the input voltage is within the defined bounds. CLC 124 is configured to change the logic of the signals that are set as input as shown in FIG. 4. C1OUT 404 may be connected as inputs to the OR with the annotation "1" and "3". To the OR annotated as "1", the signal is taken as-is, so a normal line is connected. To the OR annotated "3", the signal is negated as shown by the circle present at the input.

Figure 12:
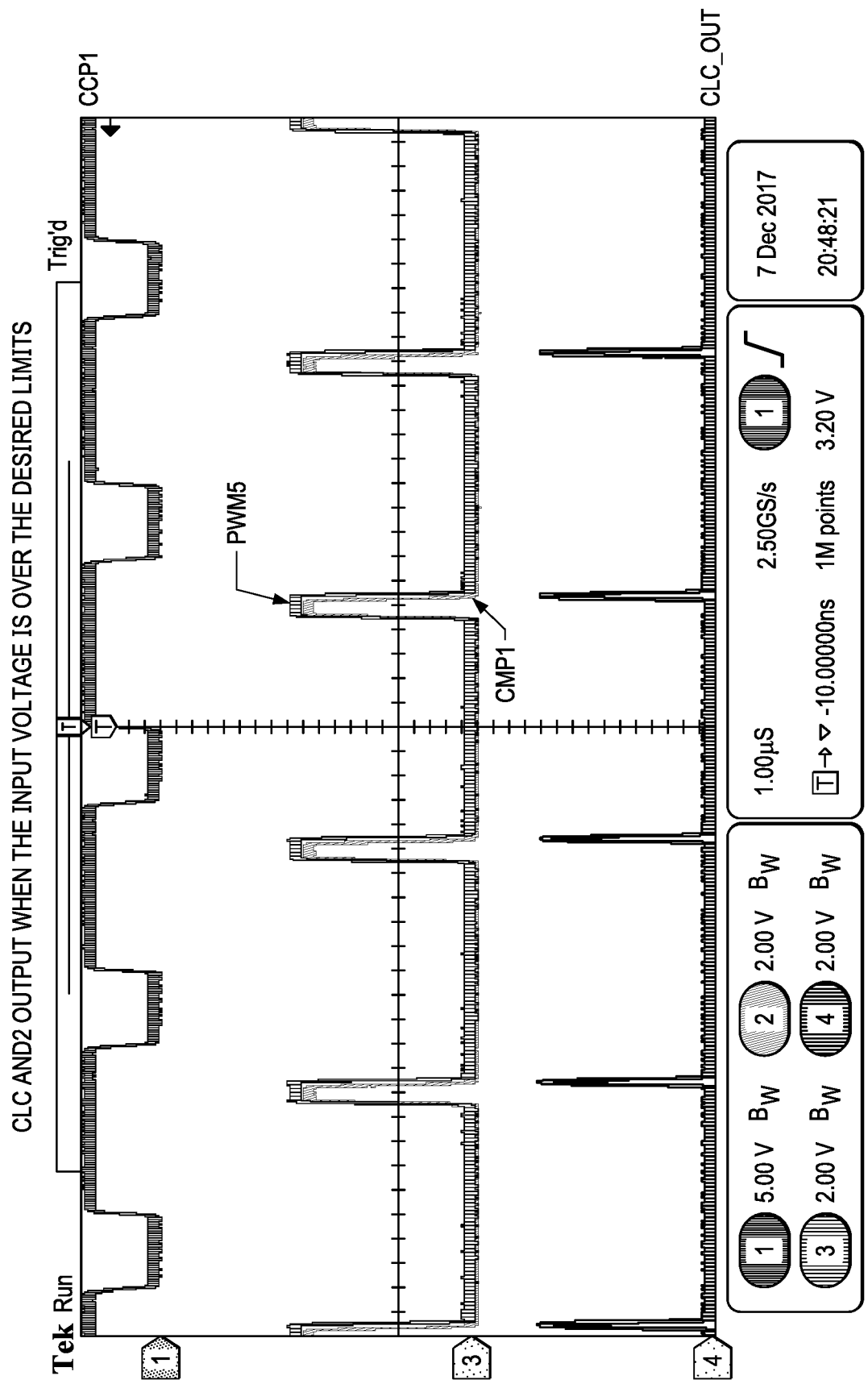

FIG. 12 illustrates CLC output (CLCAND2, CLC 124) when the input voltage is under the lower threshold voltage. FIG. 12 may correspond to FIG. 8, but with CLC output as opposed to merely comparator output. PWM5 (PWM_D 120) is also shown. The logical AND of PWM5 and negated comparator output may yield a logical high condition in the output of CLC. This may correspond to the fact that the input voltage is above the defined bounds.

In one embodiment, CLC output of FIGS. 10 and 11 may illustrate output of another half of a first stage of CLC 124.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

I claim:

1. An apparatus, comprising:
   a first pulsed-width modulation signal with a duty cycle, the duty cycle corresponding to a first cutoff voltage;
   a periodic signal generation circuit;
   a comparator configured to:
      compare a voltage input with an output of the periodic signal generation circuit; and
      based on a comparison of the voltage input with the output of the periodic signal generation circuit, generate a second pulsed-width modulation signal; and
   logic configured to compare the first pulsed-width modulation signal and the second pulsed-width modulation signal to determine whether the voltage input has reached the first cutoff voltage.

2. The apparatus of claim 1, wherein:
   the periodic signal generation circuit is configured to generate a sawtooth signal;

an upper bound of the output of the signal generation circuit corresponds to an upper voltage limit for the voltage input; and
a lower bound of the output of the signal generation circuit corresponds to a lower voltage limit for the voltage input.

3. The apparatus of claim 1, further comprising:
a third pulsed-width modulation signal corresponding to a second cutoff voltage; and
logic configured to compare the second pulsed-width modulation signal and the third pulsed-width modulation signal to determine whether the voltage input has reached the second cutoff voltage.

4. The apparatus of claim 3, further comprising a single logic output representing whether the voltage input has reached the second cutoff voltage or the first cutoff voltage.

5. The apparatus of claim 1, wherein the logic configured to compare the first pulsed-width modulation signal and the second pulsed-width modulation signal includes an AND operation with a first input of the first pulsed-width modulation signal and a second input of the second pulsed-width modulation signal.

6. The apparatus of claim 1, wherein the first pulsed-width modulation signal is delayed to match the output of the comparator.

7. The apparatus of claim 1, wherein logic configured to compare the first pulsed-width modulation signal and the second pulsed-width modulation signal is configured to provide a logic output to a shut-off of a switched-mode power supply output generator.

8. A method, comprising:
generating a first pulsed-width modulation signal with a duty cycle, the duty cycle corresponding to a first cutoff voltage;
comparing a voltage input with an output of a periodic signal generation circuit;
based on a comparison of the voltage input with the output of the periodic signal generation circuit, generating a second pulsed-width modulation signal; and
comparing the first pulsed-width modulation signal and the second pulsed-width modulation signal to determine whether the voltage input has reached the first cutoff voltage.

9. The method of claim 8, wherein:
the output of the periodic signal generation circuit is a sawtooth signal;
an upper bound of the output of the signal generation circuit corresponds to an upper voltage limit for the voltage input; and
a lower bound of the output of the signal generation circuit corresponds to a lower voltage limit for the voltage input.

10. The method of claim 8, further comprising:
generating a third pulsed-width modulation signal corresponding to a second cutoff voltage; and
comparing the second pulsed-width modulation signal and the third pulsed-width modulation signal to determine whether the voltage input has reached the second cutoff voltage.

11. The method of claim 10, further comprising representing in a single logic output whether the voltage input has reached the second cutoff voltage or the first cutoff voltage.

12. The method of claim 8, further comprising comparing the first pulsed-width modulation signal and the second pulsed-width modulation signal using an AND operation with a first input of the first pulsed-width modulation signal and a second input of the second pulsed-width modulation signal.

13. The method of claim 8, further comprising delaying the first pulsed-width modulation signal to match the output of the comparator.

14. The method of claim 8, wherein comparing the first pulsed-width modulation signal and the second pulsed-width modulation signal includes providing a logic output to a shut-off of a switched-mode power supply output generator.

15. A microcontroller, comprising:
a first pulsed-width modulation generator configured to generate a first pulsed-width modulation signal with a duty cycle, the duty cycle corresponding to a first cutoff voltage;
a periodic signal generation circuit;
a comparator configured to:
compare a voltage input with an output of the periodic signal generation circuit; and
based on a comparison of the voltage input with the output of the periodic signal generation circuit, generate a second pulsed-width modulation signal; and
logic configured to compare the first pulsed-width modulation signal and the second pulsed-width modulation signal to determine whether the voltage input has reached the first cutoff voltage.

16. The microcontroller of claim 15, wherein:
the periodic signal generation circuit is configured to generate a sawtooth signal;
an upper bound of the output of the signal generation circuit corresponds to an upper voltage limit for the voltage input; and
a lower bound of the output of the signal generation circuit corresponds to a lower voltage limit for the voltage input.

17. The microcontroller of claim 15, further comprising:
a third pulsed-width modulation generator configured to generate a third pulsed-width modulation signal corresponding to a second cutoff voltage; and
logic configured to compare the second pulsed-width modulation signal and the third pulsed-width modulation signal to determine whether the voltage input has reached the second cutoff voltage.

18. The microcontroller of claim 17, further comprising a single logic output representing whether the voltage input has reached the second cutoff voltage or the first cutoff voltage.

19. The microcontroller of claim 15, wherein the logic configured to compare the first pulsed-width modulation signal and the second pulsed-width modulation signal includes an AND operation with a first input of the first pulsed-width modulation signal and a second input of the second pulsed-width modulation signal.

20. The microcontroller of claim 15, wherein logic configured to compare the first pulsed-width modulation signal and the second pulsed-width modulation signal is configured to provide a logic output to a shut-off of a switched-mode power supply output generator.

* * * * *